(12) United States Patent
Kaneko et al.

(10) Patent No.: US 10,756,507 B2
(45) Date of Patent: Aug. 25, 2020

(54) PROCESS OF FORMING EPITAXIAL SUBSTRATE AND SEMICONDUCTOR OPTICAL DEVICE

(71) Applicants: Sumitomo Electric Industries, Ltd., Osaka-shi (JP); SUMITOMO ELECTRIC DEVICE INNOVATIONS, INC., Yokohama-shi (JP)

(72) Inventors: Toshimitsu Kaneko, Yokohama (JP); Takuya Fujii, Yokohama (JP); Masami Ishiura, Yokohami (JP); Taro Hasegawa, Yokohama (JP); Toshiyuki Taguchi, Yokohama (JP)

(73) Assignees: Sumitomo Electric Industries, Ltd., Osaka-shi (JP); Sumitomo Electric Device Innovations, Inc., Yokohama-shi (JP)

( * ) Notice: Subject to any disclaimer, the term of this patent is extended or adjusted under 35 U.S.C. 154(b) by 168 days.

(21) Appl. No.: 15/876,966

(22) Filed: Jan. 22, 2018

(65) Prior Publication Data

US 2018/0212400 A1   Jul. 26, 2018

(30) Foreign Application Priority Data

Jan. 23, 2017   (JP) ................................ 2017-009601

(51) Int. Cl.
*H01S 5/026* (2006.01)
*H01S 5/024* (2006.01)
(Continued)

(52) U.S. Cl.
CPC ........ *H01S 5/0261* (2013.01); *H01S 5/02453* (2013.01); *H01S 5/06256* (2013.01);
(Continued)

(58) Field of Classification Search
CPC .............. H01S 5/0261; H01S 5/06256; H01S 5/06258; H01S 5/125; H01S 5/1209; H01S 5/2275
See application file for complete search history.

(56) References Cited

U.S. PATENT DOCUMENTS 8,921,133 B2 * 12/2014 Yanagisawa .......... G03F 7/0002
                                                        216/24
9,025,628 B2 *  5/2015 Ishikawa ............... H01S 5/0265
                                                        372/20
(Continued)

FOREIGN PATENT DOCUMENTS

EP          0822579 A1     2/1998
JP       2009-089006 A     4/2009
(Continued)

*Primary Examiner* — Mohammed Shamsuzzaman
*Assistant Examiner* — Khatib A Rahman
(74) *Attorney, Agent, or Firm* — Baker Botts L.L.P.; Michael A. Sartori

(57) ABSTRACT

A process of forming a semiconductor optical device is disclosed. The semiconductor optical device provides a waveguide structure accompanied with a heater for varying a temperature of the waveguide structure. The process includes steps of: (a) forming a striped mask on a semiconductor substrate; (b) selectively growing a dummy layer on the semiconductor substrate; (c) removing the patterned mask; (d) burying the dummy layer by a supplemental layer; (e) exposing a portion of the dummy layer by etching a portion of the supplemental layer; (f) and removing the dummy layer by immersing the dummy layer within a solution that shows an etching rate for the dummy layer enough faster than an etching rate for the supplemental layer and the substrate so as to leave a void in a region the dummy layer had existed.

10 Claims, 14 Drawing Sheets

(51) Int. Cl.
  *H01S 5/0625* (2006.01)
  *H01S 5/125* (2006.01)
  *H01S 5/12* (2006.01)
  *H01S 5/343* (2006.01)
  *H01S 5/06* (2006.01)
  *H01S 5/227* (2006.01)

(52) U.S. Cl.
  CPC .......... *H01S 5/06258* (2013.01); *H01S 5/125* (2013.01); *H01S 5/1246* (2013.01); *H01S 5/3434* (2013.01); *H01S 5/0612* (2013.01); *H01S 5/1209* (2013.01); *H01S 5/2275* (2013.01); *H01S 5/34306* (2013.01); *H01S 5/34373* (2013.01); *H01S 2304/12* (2013.01)

(56) References Cited

U.S. PATENT DOCUMENTS

| | | | |
|---|---|---|---|
| 9,577,142 B2* | 2/2017 | Ishiura | H01S 5/1209 |
| 2001/0001734 A1* | 5/2001 | Ekawa | B82Y 20/00 |
| | | | 438/690 |
| 2004/0001522 A1* | 1/2004 | Mori | H01S 5/12 |
| | | | 372/50.11 |
| 2007/0036188 A1 | 2/2007 | Fujii | |
| 2010/0244167 A1* | 9/2010 | Konno | H01L 27/14625 |
| | | | 257/432 |
| 2010/0297789 A1 | 11/2010 | Hiratsuka | |
| 2010/0322557 A1* | 12/2010 | Matsuda | B82Y 20/00 |
| | | | 385/37 |
| 2011/0292960 A1* | 12/2011 | Shoji | H01S 5/0265 |
| | | | 372/50.11 |
| 2012/0002285 A1* | 1/2012 | Matsuda | B82Y 20/00 |
| | | | 359/576 |
| 2012/0058581 A1* | 3/2012 | Tsuji | H01S 5/12 |
| | | | 438/31 |
| 2012/0094402 A1 | 4/2012 | Uesaka et al. | |
| 2013/0011947 A1* | 1/2013 | Yanagisawa | G02B 5/18 |
| | | | 438/29 |
| 2014/0321807 A1* | 10/2014 | Sakai | G02B 6/122 |
| | | | 385/14 |
| 2015/0092799 A1* | 4/2015 | Hasegawa | H01S 5/0261 |
| | | | 372/20 |
| 2016/0327743 A1* | 11/2016 | Kippenberg | G02B 6/122 |
| 2018/0212400 A1* | 7/2018 | Kaneko | H01S 5/125 |

FOREIGN PATENT DOCUMENTS

| | | |
|---|---|---|
| JP | 2012-174938 A | 9/2012 |
| JP | 2015-170750 A | 9/2015 |

* cited by examiner

PROCESS OF FORMING EPITAXIAL SUBSTRATE AND SEMICONDUCTOR OPTICAL DEVICE

BACKGROUND OF THE INVENTION

1. Field of the Invention

The present invention relates to a process of forming a semiconductor optical device, in particular, the invention relates to a process of forming a wavelength tunable laser diode (LD).

2. Background Arts

One type of wavelength tunable LD provides a heater on a reflector region that includes an optical waveguide layer. Powering the heater, the reflector region may change a temperature thereof, which means that refractive index therein also varies; wavelength characteristics in the waveguide layer may be varied. On the other hand, a semiconductor device including a semiconductor optical device is always requested to save operation power thereof. A Japanese Patent application laid open No. 2012-174938 has disclosed a technique to form voids under the waveguide layer to enhance thermal insulation. However, it has been hard to make the waveguide layer flat enough so as to reduce the optical loss.

SUMMARY OF INVENTION

One aspect of the present invention relates to a process of forming a void within semiconductor layers including first and second semiconductor layers. The process includes steps of: (a) forming a patterned mask on the first semiconductor layer that is made of first semiconductor material; (b) forming a dummy layer made of specific semiconductor material; (c) removing the patterned mask; (d) burying the dummy layer by forming the second semiconductor layer on the dummy layer and the first semiconductor layer that is exposed from the dummy layer, where the second semiconductor layer is made of the second semiconductor material different from the specific semiconductor material; (e) exposing a portion of the dummy layer by removing a portion of the second semiconductor layer; and (f) forming a void by removing the dummy layer by immersing the first semiconductor layer, the dummy layer, and the second semiconductor layer within a solution that shows an etching rate for the specific semiconductor material enough faster than an etching rate for the first and second semiconductor materials.

Another aspect of the present invention relates to a process of forming a semiconductor optical device that provides a waveguide structure and a heater provided above the waveguide structure, where the heater may vary a temperature of the waveguide structure. The process comprises steps of: (a) forming a striped mask on a semiconductor substrate; (b) selectively growing a dummy layer on the semiconductor substrate exposed from the striped mask; (c) removing the striped mask; (d) burying the dummy layer by growing a supplemental layer on the dummy layer and the semiconductor substrate exposed from the dummy layer; (e) forming the waveguide structure on the supplemental layer so as to overlap with the void; (f) forming a groove in the supplemental layer, where the groove reaches the dummy layer; and (g) immersing the semiconductor substrate within an etchant so as to form a void in a region the dummy layer exists, where the etchant shows an etching rate for the dummy layer enough faster than an etching rate for the supplemental layer and the semiconductor substrate.

BRIEF DESCRIPTION OF THE DRAWINGS

The foregoing and other purposes, aspects and advantages will be better understood from the following detailed description of a preferred embodiment of the invention with reference to the drawings, in which.

DESCRIPTION OF EMBODIMENT

Next, embodiment according to the present invention will be described as referring to accompanying drawings. In the description of the drawings, numerals or symbols same with or similar to each other will refer to elements same with or similar to each other without duplicating explanations.

Figure 14A:
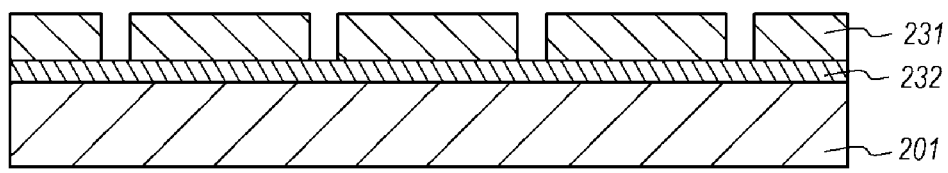
FIG. 14A to FIG. 14C show cross sections at respective steps of the conventional process of forming the semiconductor optical device.
Figure 14B:
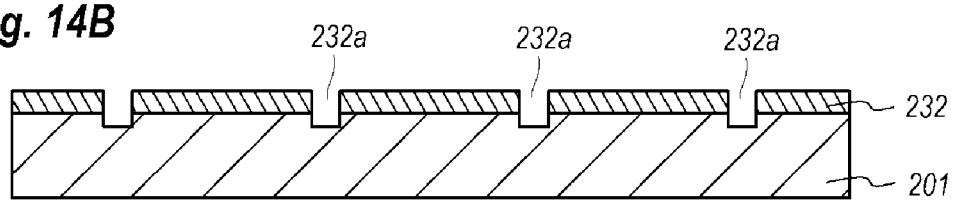
Figure 14C:
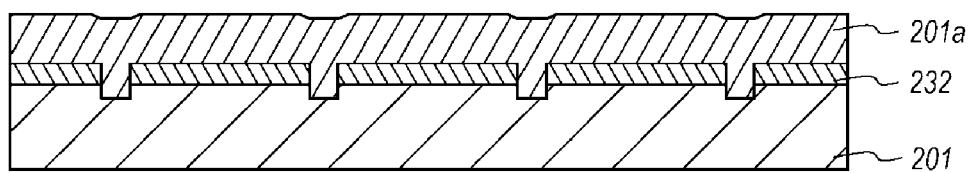

First, a conventional process for forming a void beneath a mesa for an optical waveguide will be described. Figures from FIG. 14A to FIG. 14C show cross sections of a semiconductor optical device at respective steps in a conventional process. The process first grows a dummy layer 232 made of, for instance, indium gallium arsenide (InGaAs) on a semiconductor substrate 201 made of, for instance, indium phosphide (InP), where the dummy layer 232 shows an etching rate higher than that of the semiconductor substrate 201. Then, a mask 231, which may be made of silicon oxide ($SiO_2$) is patterned on the dummy layer 232. The dummy layer 232 and the semiconductor substrate 201 in a portion thereof are etched to expose the semiconductor substrate 201 within windows 232a in the dummy layer 232, as shown FIG. 14B. The windows 232a and hollows accompanied with the windows 2323a in the substrate 201 are buried with a supplemental layer 201a as shown in FIG. 14C.

Regions not covered with the dummy layers 232 that correspond to windows 232a finally become supports for supporting semiconductor layers provided above the dummy layers 232. An etchant such as a mixture of sulfuric acid, hydrogen peroxide, and water may show an etching rate for the dummy layers 232 that is ten times or faster than the etching rate for the supplemental layer 201a and the substrate each made of InP. Accordingly, forming the waveguide structure on the supplemental layer 201a in regions overlapping with the dummy layers 232, exposing a portion of the dummy layers 232 by forming, for instance, grooves reaching the dummy layers 232, and immersing the substrate 201 within such an etchant, the dummy layers 232 may be removed to form voids under the waveguide structure provided above the supplemental layer 201a.

However, the conventional process described above to form the voids has various subjects. The first subject is hard to flatten the top surface of the supplemental layer 201a as shown in FIG. 14C. The dummy layer 232, as described above, is necessary to have the etching rate enough faster than that of the substrate 201 and the supplemental layer 201a, which means that the windows 232a is necessary to be formed by the dry process such as reactive ion etching (RIE). But, such a dry etching inherently shows an etching rate for the substrate 201 made of InP that is comparable to the etching rate for the dummy layer 232; accordingly, a substantial portion of the substrate 201 is inevitably etched to securely form the window 232a, namely without leaving any residues of the dummy layer 232 within the window 232a, as shown in FIG. 14C. When residues of the dummy layer 232 are left within the window 232a, the support to be formed in the window 232a becomes unstable or the waveguide structure provided above the void would be crushed. In order to fully remove the dummy layer 232 in the window 232a, an excess etching of 30 to 50% is necessary, which digs the substrate 201 by a substantial depth. Thus, the conventional process inevitably forms deep windows and becomes hard to flatten the surface of the supplemental layer 231 in the portion corresponding to the window 232a.

The second subject relates to productivity of the semiconductor optical device. Because of the first subject above described, the conventional process is inevitable to investigate or control the depth of the window 232a. However, the investigation of the depth of the window 232a is necessary to be carried out under a condition where the mask used for forming the window 232a is left on the dummy layer 232, which means that the accuracy of the measurement of the depth is not ensured. Accordingly, the present invention provides a technique to make the surface of the supplemental layer flat and smooth enough for the waveguide structure formed thereon.

First Embodiment

Figure 1A:
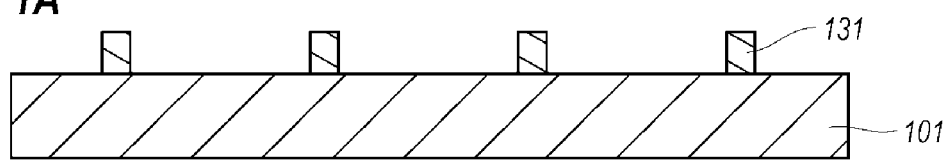
FIG. 1A to FIG. 1D show cross sections of an epitaxial substrate at respective steps of the process of forming an epitaxial substrate according to the first embodiment of the present invention.
Figure 1B:
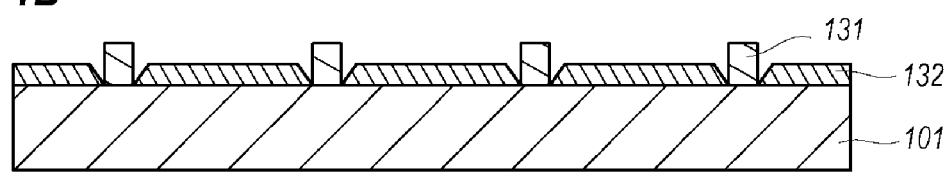
Figure 1C:
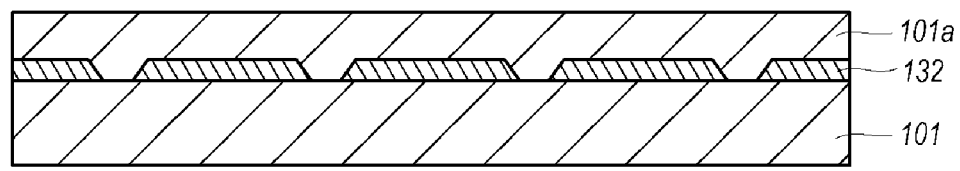
Figure 1D:
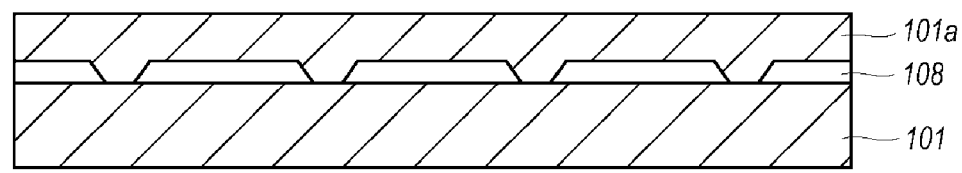

FIG. 1A to FIG. 1D show cross sections of a semiconductor optical device at respective steps of a process for forming an epitaxial substrate including voids according to the first embodiment of the present invention. The process first forms stripe patterns 131 on a top surface of a substrate 101 made of indium phosphide (InP), where the stripe patterns 131 may be made of insulating material and a position thereof is to be converted into a support by subsequent processes. Thereafter, a dummy layer 132 made of indium gallium arsenide (InGaAs) is epitaxially and selectively grown on an exposed top surface of the substrate 101 between the stripe pattern 131 as shown in FIG. 1B. Removing the stripe pattern 131, a supplemental layer 101a made of InP is epitaxially grown on the dummy layers 132 and the exposed top surface of the substrate 101 between the dummy layers 132 so as to fully bury the dummy layers 132. The supplemental layer 101a grown between the dummy layers 132 becomes the supports that are made of InP. Thereafter, the process grows a waveguide layer on the supplemental layer 101a so as to overlap with at least one dummy layer 132. Exposing a portion of the dummy layer 132, and dipping the substrate 101 within a solution that may etch the dummy layer 132 enough faster than the substrate 101 and the supplemental layer 101a, the dummy layer 132 may be removed so as to leave the void in a region where the dummy layers 132 had existed.

When the dummy layer 132 is selectively grown on the substrate 101, the crystal surface of (111)B appears by which the epitaxial growth ceases, which may be called as the growth terminating surface, and slant surfaces with inclined angles smaller than 90°, specifically about 45°, exactly 41.3°, against the surface of the substrate 101 appears along the striped pattern 131 that extends along the crystal orientation of [0-11], or [01-1], as shown in FIG. 1B. On the other hand, the growth terminating surface does not generally appear along the normal of the semiconductor substrate 101. In other word, because a growth rate of a semiconductor material shows a smaller growth rate on the normal slope, valleys between the mesas are smoothly buried by the grown material, which also means that the top or the surface of the supplemental layer 101a becomes smooth and flat. The flatness of the substrate, or the surface of the grown layer, becomes a key feature not only deciding a linearity of the waveguide formed on the surface of the supplemental layer 101a but determining preciseness of the process. A description that the surface of the supplemental layer 101a becomes flat means that the surface roughness, or a step appearing in the surface of the supplemental layer, is less than a half of a thickness of the dummy layer 132. In other words, the surface of the supplemental layer 101a preferably has flatness such that the waveguide formed thereon has a center with unevenness less than 10 nm.

Second Embodiment

Figure 2A:
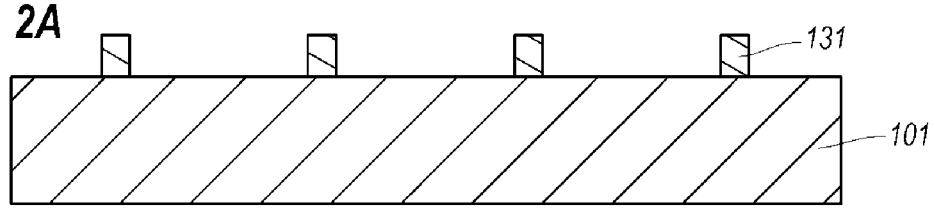
FIG. 2A to FIG. 2E show cross sections of an epitaxial substrate at respective steps of another processes of forming a semiconductor optical device according to the second embodiment of the present invention.
Figure 2B:
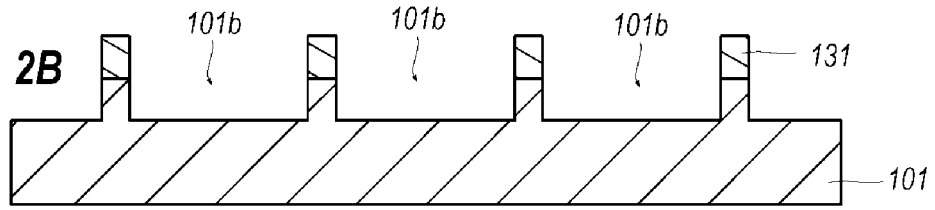

Figures from FIG. 2A to FIG. 2E show cross sections of the epitaxial substrate at respective steps of the process of forming it according to the second embodiment of the present invention by cross sections thereof. The process first forms striped pattern 131 on the InP substrate 101, where the striped pattern 131 are formed in respective regions for supports, as shown in FIG. 2A. Then, the process etches the InP substrate 101 exposed between the striped patterns 131. Etching a portion of the InP substrate 101 with a depth of about 0.4 µm, hollows 101b are formed between the striped patterns 131 as shown in FIG. 2B.

Figure 2C:
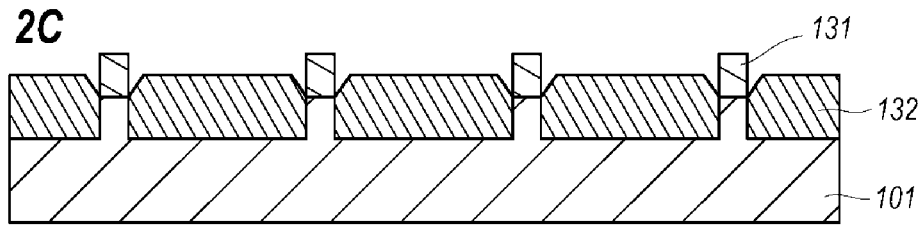
Figure 2D:
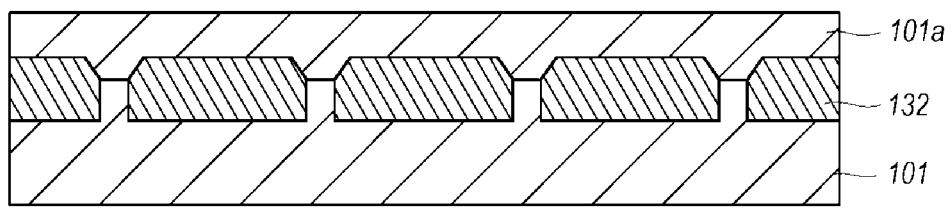
Figure 2E:
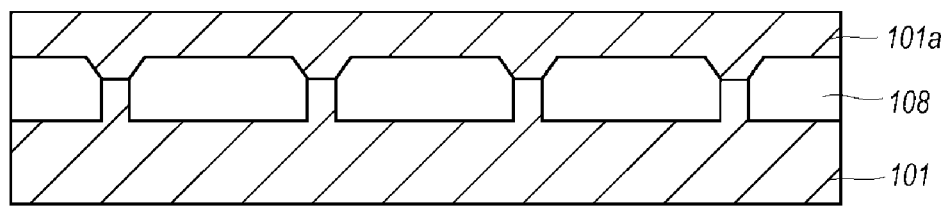

Thereafter, a selective growth of the dummy layer 132 made of InGaAs may fill the hollows 101b, as shown in FIG. 2C. In this selective growth, a normal slope with an angle smaller than 90° against the bottom of the hollows 101b appears in respective sides of the striped patterns 131. Then, removing the striped patterns 131 and growing the supplemental layer 101a, the dummy layers 132 are fully buried by the supplemental layer 101a. Portions of the supplemental layer 101a filling regions between the dummy layers 132 become supports, as shown in FIG. 2D. Thereafter, the process grows the waveguide layer on the supplemental layer 101a so as to include at least one dummy layer 132. Then, the process exposes portions of the dummy layer 132 by etching the supplemental layer 101a and etching the dummy layer 132 by an etchant showing an etching rate for the dummy layer 132 enough faster than that for the supplemental layer 101a and the substrate 101; the voids 108 may be left within the burying layer 101a and the substrate 101 in a region where the dummy layer 132 had existed.

Because the second embodiment thus described first etches the substrate 101, the dummy layer 132 may be formed thicker compared with the first embodiment without increasing the thickness of the supplemental layer 101a; accordingly, the void 108 may have a thickness or a height greater than that of the first embodiment. Even when the striped pattern 131 is formed thicker to enhance the thickness of the dummy layer 132, the normal slope of the dummy layer 132 begins from the root of the striped pattern 131, which not only widens the supports formed in the positions of the striped pattern but the supplemental layer 101a in the surface thereof causes larger steps.

Third Embodiment

Figure 3A:
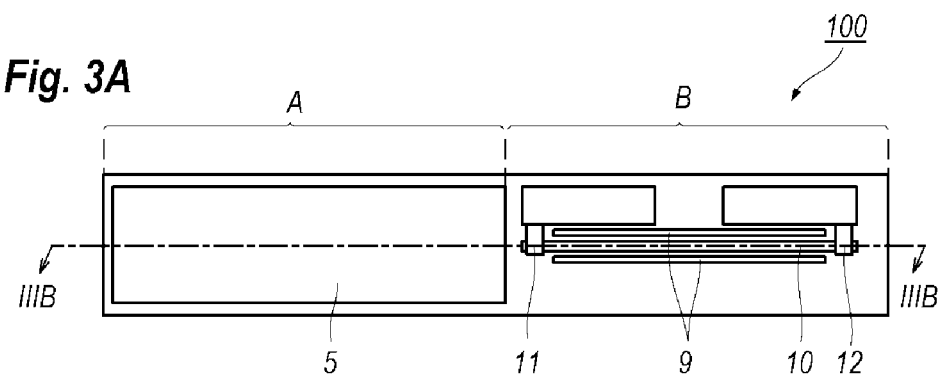
FIG. 3A is a plan view of a semiconductor optical device according to the third embodiment of the present invention.
Figure 3B:
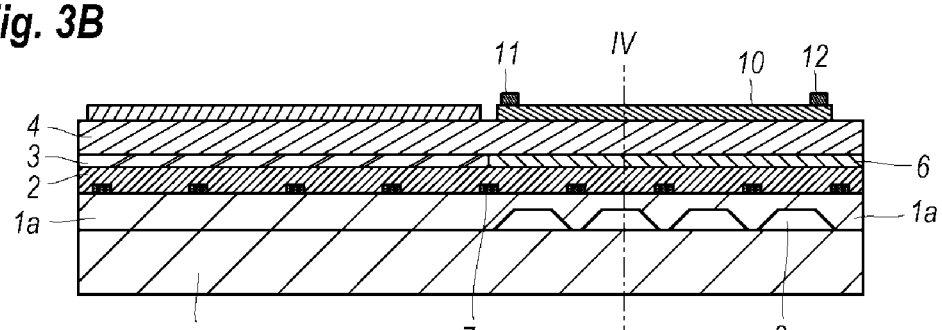
FIG. 3B shows a cross section of the semiconductor optical device taken along the line IIIB-IIIB indicated in FIG. 3A.
Figure 3C:
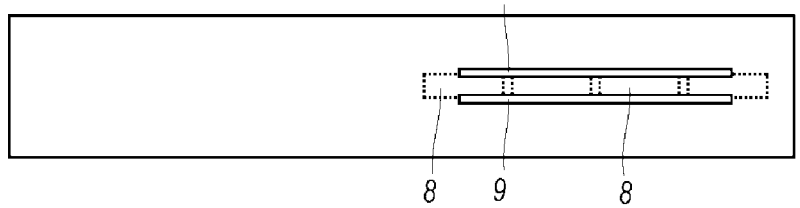
FIG. 3C is a plan view of voids and grooves formed in the semiconductor optical device.
Figure 3D:
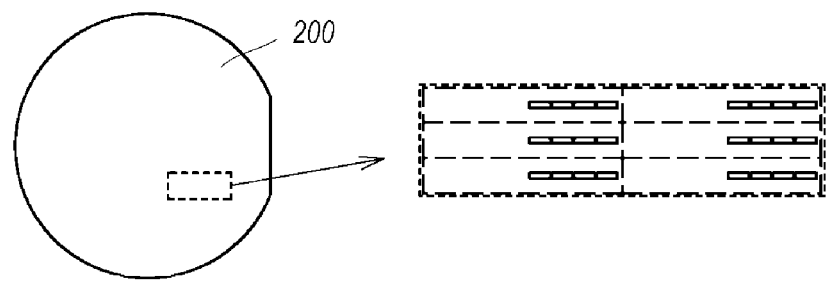
FIG. 3D is a plan view of a wafer within which a plurality of the semiconductor optical devices are processed.

FIG. 3A is a plan view of a semiconductor optical device 100 according to the third embodiment of the present invention; FIG. 3B shows a cross section of the semiconductor optical device 100 shown in FIG. 3A taken along the line IIIB-IIIB indicated in FIG. 3A; FIG. 3C sees through the void 8 from the top of the semiconductor optical device 100; and FIG. 3D is a plan view of a wafer 200 within which a plurality of the semiconductor optical devices 100 are processed.

The semiconductor optical device 100 provides a region A including a sampled grating distributed feedback (SG-DFB) and a region B including a sampled grating distributed Bragg reflector (SG-DBR). The SG-DBR region B includes a pair of grooves 9 in respective sides of the waveguide structure.

The SG-DFB region A operates as an optical gain region of the semiconductor optical device 100. Specifically, as shown in FIG. 3B, the SG-DFB region A includes a stack comprised of a lower cladding layer 2, an active layer 3, an upper cladding layer 4, and an electrode 5, where the lower and upper cladding layers, 2 and 4, putting the active layer 4 therebetween form an optical confinement structure.

The SG-DBR region B may operate as an optical reflector. The SG-DBR region B also includes a stack comprised of the lower cladding layer 2, a waveguide layer 6, and the upper cladding layer 4, where the lower and upper cladding layers, 2 and 4, putting the waveguide layer 6 therebetween to form the optical confinement structure. The lower cladding layer 2 and the upper cladding layer 6 are common to the SG-DFB region A and the SG-DBR region B. The SG-DBR region B further includes a heater 10 above the upper cladding layer 4, where the heater 10 provides a power electrode 11 and a ground electrode 12. Supplying electrical power between the power electrode 11 and the ground electrode 12, the heater may generate heat to raise a temperature of the SG-DBR region B.

The SG-DFB region A and the SG-DBR region B are integrated on a semiconductor substrate 1 as the active layer 3 in the SG-DFB region A optically couples with the waveguide layer 6 in the SG-DBR region B.

The SG-DFB region A and the SG-DBR region B provide structures of diffraction gratings 7 that are periodically disposed, where the diffraction gratings each include corrugations. A context "corrugation" is derived from an envelope of the structures during the process of forming the corrugation. That is, the process first growing a layer made of semiconductor material different from that of the lower cladding layer 2. Then, this layer is partly etched so as to leave stripes periodically disposed along an optical axis. The envelope of the stripes seems to be the corrugations. These corrugations are buried with by the lower cladding layer 2, where the lower cladding layer 2 provides a flat top surface thereof. One diffraction grating and a space without any corrugations next to the diffraction grating form a segment. The semiconductor material forming the corrugations may be mad of $Ga_{0.22}In_{0.75}As_{0.47}P_{0.53}$ when the lower cladding layer 2 is made of InP, where those two semiconductor materials have refractive indices different from each other. The periodically disposed diffraction grating 7 forms a sampled grating.

The periodic patterns for forming the diffraction gratings 7, namely, corrugations, may be formed by, what is called, two beams interference exposure technique, or the electron beam (EB) lithography. The spaces between the diffraction gratings 7 are formed by the duplicated exposure to erase the trace formed by the two beam interference exposure.

In the SG-DFB region A, the segments have a unique optical length, while, the segments in the SG-DBR region B also has another unique optical length but different from the unique optical length in the SG-DFB region A. The corrugations in the respective regions, A and B, have a pitch or a period common in the two regions, A and B. One exemplary condition for the one diffraction grating includes 20 corrugations with a pitch of 240 nm, which becomes 4.8 µm in a physical length of the one diffraction grating 7 along the optical axis. The space in the SG-DFB region A has a length of 66.0 µm, which means that the optical length of one segment in the SG-DFB region A becomes 70.8 µm. On the other hand, the spaces in the SG-DBR region B have a physical length of 73.1 µm, which means that the one segment in the SG-DBR region B has a length of 77.9 µm. Thus, the SG-DFB region A may show an optical gain spectrum with a plurality of gain peaks, while, the SG-DBR region B may show a reflection spectrum including a plurality of reflection peaks, where the gain peaks has a period different from a period in the periodic reflection peaks. Accordingly, the semiconductor optical device 100 may emit light with a specific wavelength at which one of the gain peaks attributed to the SG-DFB region A becomes identical with one of the reflection peaks attributed to the SG-DBR region A. This mechanism to tune an emission wavelength of the semiconductor optical device 100 is often called as the Vernier effect.

The semiconductor substrate 1, the lower cladding layer 2, the upper cladding layer 4 may be made of n-type InP, n-type InP, and p-type InP, respectively. As described, the lower and upper cladding layers, 2 and 4, form the optical confinement structure accompanied with the active layer 3 in the SG-DFB region A and the waveguide layer 6 in the SG-DBR region B.

The active layer 3 may show an optical gain by injecting carries therein. The active layer 3 may have a multi-quantum-well (MQW) structure including a plurality of well layers each made of $Ga_{0.32}In_{0.68}As_{0.92}P_{0.08}$ and a plurality of barrier layers each made of $Ga_{0.22}In_{0.78}As_{0.47}P_{0.53}$ alternately stacked each other. The waveguide layer 6 may be made of bulk semiconductor material, for instance, $Ga_{0.22}In_{0.75}As_{0.47}P_{0.53}$.

The heater 10 is a type of thin-film heater made of Nichrome™ (NiCr), where the heater 10 overlaps with two or more segments in the SG-DBR region B. The electrode 5, the power electrode 11, and the ground electrode 12 are made of metal, where the electrode 5 in the SG-DFB region A may put a contact layer made of, for instance, heavily doped p-type $Ga_{0.47}In_{0.53}As$. The semiconductor substrate 1 may provide a back metal extending from the SG-DFB region A to the SG-DBR region B.

The SG-DBR region B provides a plurality of void 8 beneath the waveguide layer 6 along the propagating direction of the light, namely, the optical axis of the semiconductor optical device 100. The waveguide layer 6 or the active area in the SG-DBR region B, similar to those in the first and second embodiments, may be supported with the supports in respective sides thereof along the optical axis. The active area in the SG-DBR region B includes semiconductor layers from the void 8 to the heater 10.

An operating mechanism of the semiconductor optical device 100 will be further described. Supplying the current in the electrode 5 and setting a temperature of the semiconductor optical device 100 in a preset condition by adjusting an ambient temperature, the gain spectrum attributed to the SG-DFB region A may be determined in the period of the gain peaks and the respective wavelengths of the gain peaks. Then, supplying power to the heater 10 in the SG-DBR region B, which raises a temperature in the SG-DBR region B and determines a period between the neighbor reflection peaks and the respective wavelengths of the reflection peaks, the semiconductor optical device 100 may emit light with the wavelength at which one of the gain peaks matches with one of the reflection peaks. Adjusting the power supplied to the heater 10 in the SG-DBR region B, which modifies the refractive index in the waveguide layer 6, may vary the period between the reflection peaks and the wavelengths thereof, the wavelength at which the one of the gain peaks matches with one of the reflection peaks may be varied, or tuned.

The waveguide layer 6 in the SG-DBR region B may be varied in the refractive index thereof by the carrier injection, a thermal-optical effect, an electro-optical effect, and so on. The present embodiment utilizes the thermal-optical effect. Among various techniques for varying the refractive index in the waveguide layer 6, the thermal-optical effect causes substantially no optical loss; but efficiency for tuning the wavelength by the thermal-optical effect is limited to only 0.1 nm/° C., which means that a temperature difference of 36° C. is necessary for shifting the emission wavelength of the semiconductor optical device 100 merely by 3.6 nm. In order to vary the temperature of the semiconductor optical device in such a large difference, an arrangement is inevitable for conducting heat from the heater 10 to the waveguide layer 6 efficiently. The optical device 100 of the present embodiment provides the void 8 beneath the waveguide layer 6, where the void 8 may thermally isolate the waveguide layer 6 from the semiconductor substrate 1 or may enhance thermal isolation of the waveguide layer 6 from the semiconductor substrate 1. Heat generated by the heater 10 is hard to be dissipated beneath the void 8. Besides, the waveguide layer 6 accompanies the grooves in the respective sides thereof, which may also enhance the thermal isolation of the waveguide layer 6 from regions in respective sides thereof. Thus, the waveguide layer 6 may be effectively and easily varied in the temperature thereof in a wide range.

The void 8 beneath the waveguide layer 6 may thermally isolate the waveguide layer 6 from the substrate 10. A semiconductor optical device, which implements the carrier injection not the heat from the heater for modifying the refractive index in the waveguide layer 6, may have the thermally isolated structure. That is, the void beneath the waveguide layer 6 may thermally isolate the waveguide layer 6 from the substrate 10; accordingly, the waveguide layer 6 may efficiently reflect the effect by the carrier injection.

The SG-DFB region A has no voids beneath the active layer, that is, the active layer 3 thermally couples with the temperature controller, on which the semiconductor optical device 100 is mounted, through the semiconductor substrate 10. Accordingly, the temperature controller may securely and reliably control the temperature of the active layer 3 in the SG-DFB region A, which means, the temperature controller may set the emission wavelength of the semiconductor optical device 100 in a pre-determined wavelength, generally, one of grid wavelengths of the wavelength division multiplexing (WDM) communication system.

From FIG. 4A to FIG. 5D show cross section at respective steps of the process of forming the semiconductor device 100, where the cross sections are taken along the ling IV-IV indicated in FIG. 3B. The process described below assumes that semiconductor layers are epitaxially grown by metal organic chemical vapor deposition (MOCVD) technique.

Figure 4A:
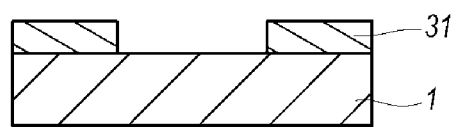
FIG. 4A to FIG. 4D show cross section at respective steps of the process of forming the semiconductor optical device according to the forth embodiment of the present invention.

The process first forms a patterned mask 31 made of insulating material, for instance, silicon di-oxide ($SiO_2$) with a thickness of 2 μm, on a semiconductor substrate 1, as shown in FIG. 4A. The mask 31 has an opening that exposes a surface of the semiconductor substrate 1 in a region where the void is to be formed. Silicon di-oxide ($SiO_2$) may be easily patterned by wet-etching a portion thereof.

Then, a selective growth of the dummy layer 32 made of InGaAs that matches the lattice constant thereof with that of InP is formed on the semiconductor substrate 1 exposed within the opening of the mask 31. The selective growth may only grow the dummy layer 32 within the opening but prevent the dummy layer 32 from growing on the mask 31. The dummy layer 32 may accompany with a protecting layer 33 made of InP, which may effectively prevent arsenic (As) from detaching from InGaAs of the dummy layer 32.

Figure 4B:
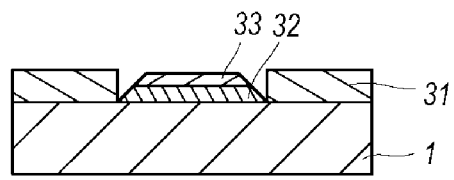
Figure 4C:
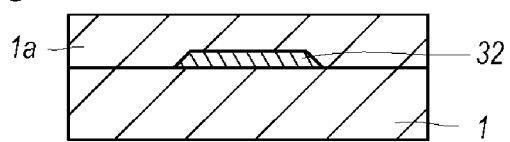

Thereafter, as shown in FIG. 4C, removing the patterned mask 31, the process grows an n-type InP supplemental layer 1a by a thickness of 1.5 μm so as to bury the dummy layer 32. Thus, the process may form a semiconductor epitaxial substrate 1 with a flat and smooth top surface of the n-type InP supplemental layer 1a. The void are to be formed beneath the optical waveguide to be implemented with the heaters; accordingly, the InGaAs dummy layers 32 are selectively grown in restricted regions within the wafer 200 as shown in FIG. 3D.

The process then forms the diffraction gratings. Specifically, the process grows an InGaAsP layer with the bandgap wavelength of 1.3 μm, which may be evaluated from a photoluminescence wavelength, then forms corrugations by partially etching the grown InGaAsP layer using a pattern formed by the electron beam (EB) lithography. The corrugations are arranged into five groups in the gain region A each having a length of 10 μm along the optical axis and a span of 200 μm to the next group, which forms the sampled grating distributed feedback (SF-DFB); while, the reflection region B also arranges five (5) groups of the corrugations each having a length of 10 μm along the optical axis and a span of 200 μm to the next group, which forms the sampled grating distributed Bragg reflector (SG-DBR). Thus, the SG-DFB in the gain region A optically couples with the SG-DBR in the reflection region B along the optical axis of the optical device 100, that is, along a propagating direction of light attributed to the semiconductor optical device 100.

Figure 4D:
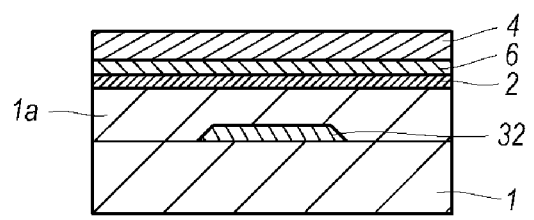

Thereafter, the process buries the diffraction gratings 7 by the lower cladding layer 2 by growing the layer 2 by a thickness of 500 nm as shown in FIG. 4D. Then, in the gain region A, the process sequentially grows an n-type space layer by a thickness of 200 nm, which is not shown in the figures, and the active layer 3 with a multiple-quantum-well (MQW) structure having a bandgap wavelength of 1.55 μm measured by the photoluminescence. Thereafter, in the reflection region, removing thus grown active layer 3 and selectively growing the waveguide layer 6 having the bandgap wavelength of 1.3 μm measured through the photoluminescence by a thickness of 100 nm. The active layer 3 in the gain region A and the waveguide layer 6 in the reflection region B form flat and smooth top surfaces. Finally, the process grows an n-type InP by a thickness of 1.0 μm as the upper cladding layer on the flat and smooth top surfaces of the active layer 3 and the waveguide layer 6, then, grows an InGaAs layer by a thickness of 100 nm as the contact layer.

Figure 5A:
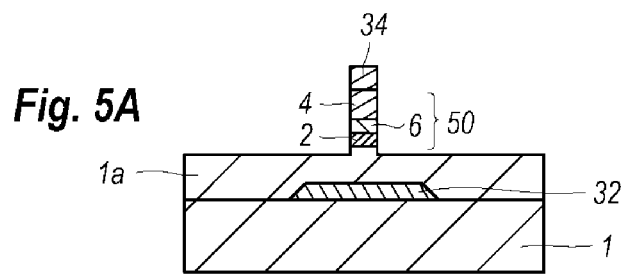
FIG. 5A to FIG. 5D show cross sections at respective steps subsequent to the step shown in FIG. 4D.
Figure 5B:
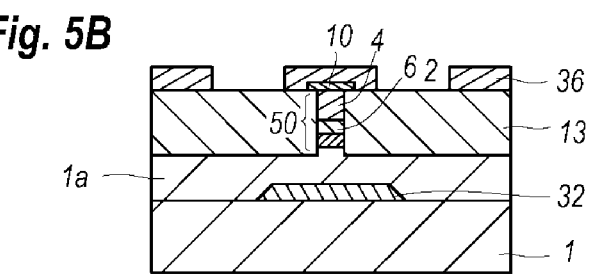
Figure 5C:
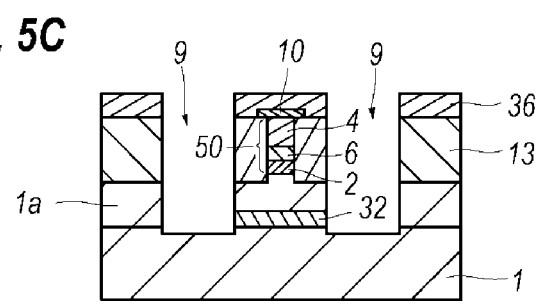
Figure 5D:
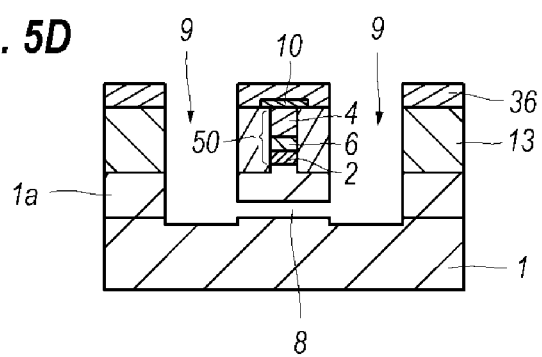
Figure 6A:
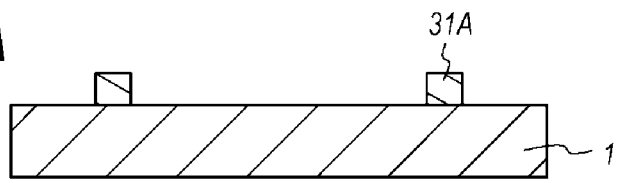
FIG. 6A to FIG. 6D show cross sections at respective steps of the process of forming the semiconductor optical device according to the fourth embodiment of the present invention.
Figure 6B:
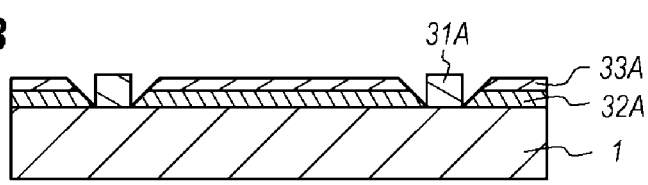
Figure 6C:
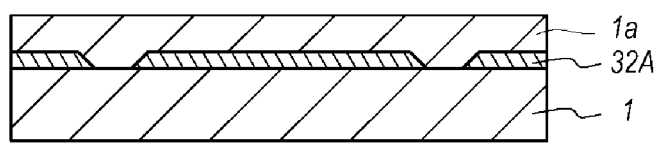
Figure 6D:
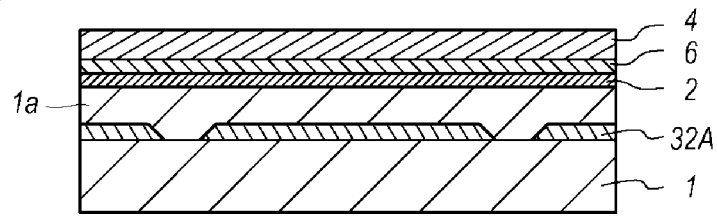

Thereafter, forming a striped mesa 50 including the lower cladding layer 2 with the diffraction gratings 7, the active layer 3 or the waveguide layer 6, the upper cladding layer 4 and the contact layer by etching, using a patterned mask 34, portions of those layers of the lower cladding layer 2, the active layer 3 or the waveguide layer 6, the upper cladding layer 6 and the contact layer, as shown in FIG. 5A. Selectively growing burying layers 13 made of InP in respective sides of thus formed mesa 50 so as to bury the mesa 50 as shown FIG. 5B, a semi-insulating buried hetero (SI—BH) structure formed by InP may be obtained. Then, as shown in FIG. 5B, the process forms the heater 10 on the waveguide structure in the SG-DBR region B, and covers thus formed heater 10 with silicon di-oxide (SiO₂) film 36, where the SiO₂ film 36 provides openings in respective sides of the mesa 50. Etching the burying layer 13 exposed in the opening in the SiO₂ film and the supplemental layer 1a sequentially; two grooves 9 reaching the substrate are formed in respective sides of the mesa 50, as shown in FIG. 5C. Two grooves 9 may form another mesa stripe including the former mesa 50 that is comprised of the diffraction gratings 7, the lower cladding layer 2, the waveguide layer 6, and the upper cladding layer 4. The grooves 9 reach the dummy layer 32 so as to expose sides of the dummy layer 32. Then, as shown in FIG. 5D, etching the dummy layer 32 using an etchant of, for instance, a mixture of sulfuric acid and hydrogen peroxide, the thermally isolating structure with the void 8 beneath the waveguide layer 6 may be formed.

The description above concentrates on an example that the dummy layer 32 may be made of InGaAs. However, the dummy layer is not restricted to InGaAs. A material, which is able to be selectively grown on the substrate 1, and selectively removed as leaving the lower cladding layer 2, the waveguide layer 6, and the upper cladding layer 4, may be applicable to the dummy layer. For instance, materials of InGaAsP, InGaAlAs, InAlAsP, InGaAlAsP, and so on may be used as the dummy layer 32.

The semiconductor optical device according to the present embodiment may provide an epitaxial substrate that includes the lower cladding layer 2 with a flat and smooth top surface thereof on the InP substrate 1, the waveguide layer 6 formed on the lower cladding layer 2 may be not only easily grown but may have a performance with restricted optical loss because of the flatness of the top surface of the lower cladding layer 2. The present embodiment forms the first patterned mask 31 on the first semiconductor layer, namely, the semiconductor substrate 1 made of the first semiconductor material, InP; selectively forms the dummy layer 32 made of a specific semiconductor material, InGaAs, that is different from the first semiconductor material on the exposed surfaced of the first semiconductor layer. Removing the first patterned mask 31, the process further forms the second semiconductor layer, namely, the supplemental layer 1a so as to bury the dummy layer 32. Then, the waveguide layer 6 is formed so as to overlap with the dummy layer 32. Exposing a portion, or an edge of the second semiconductor layer by etching the second semiconductor layer, then etching the dummy layer by an etchant that shows an etching rate for the specific semiconductor material, InGaAs, enough faster than the etching rate for the first and second semiconductor materials, InP. Thus, the void may be formed beneath the waveguide layer 6, where the void may thermally isolate the waveguide layer 6 from the first semiconductor layer, namely, the semiconductor substrate 1.

Fourth Embodiment

From FIG. 6A to FIG. 7D show cross sections of the semiconductor optical device at respective steps of the process of forming the semiconductor optical device according to the fourth embodiment of the present invention. The process according to the present embodiment has sequence substantially same with those of the third embodiment but has a feature that the mask 31A for selectively growing the dummy layer 32A has a pattern different from those of the aforementioned embodiment. That is, the mask 31A, as shown in FIG. 8A, has a pattern surrounding areas 31a where the voids 8 are to be formed. That is, the mask 31A divides the area 31a from another area 31a' where no voids are to be formed and the dummy layer 32A is left. In the present embodiment, the mask 31A in coverage thereof for the semiconductor substrate becomes small enough, which means that the area on the substrate 1 to be covered with the supplemental layer 1a becomes small enough and the flatness of the top surface of the supplemental layer 1a may be further secured.

Figure 7A:
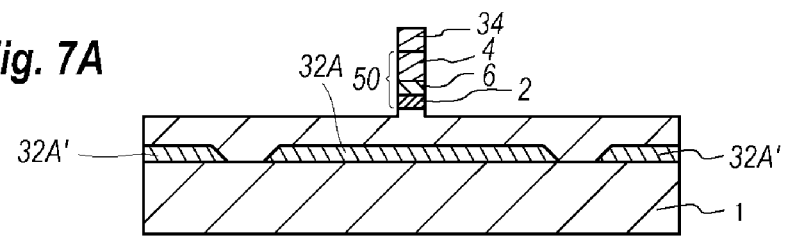
FIG. 7A to FIG. 7D show cross sections at respective steps subsequent to the step shown in FIG. 6D.
Figure 7B:
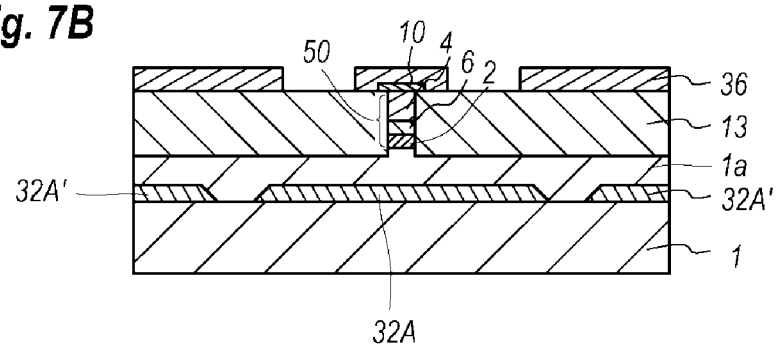
Figure 7C:
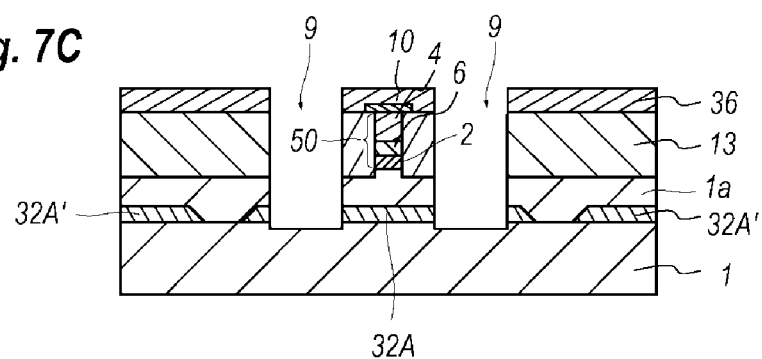
Figure 7D:
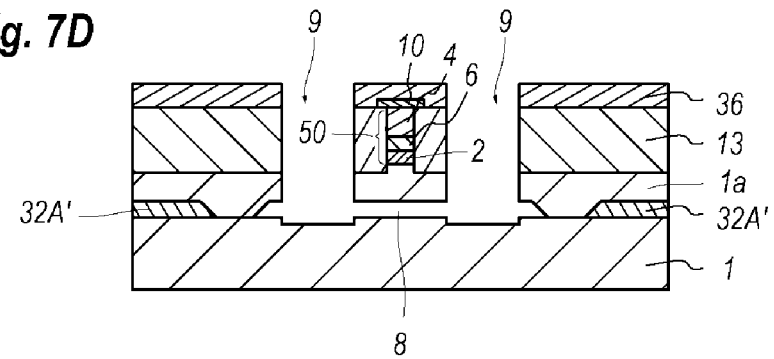
Figure 8A:
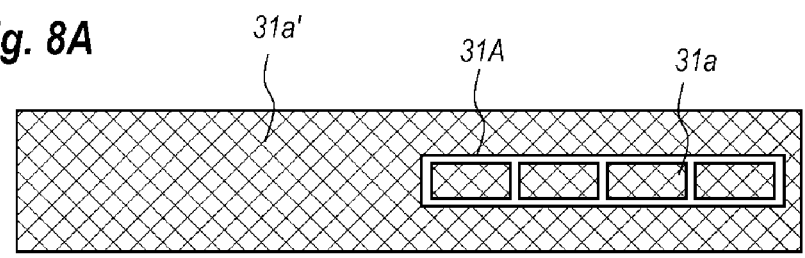
FIG. 8A shows a plan view of the semiconductor substrate after the growth of the supplemental layer.
Figure 8B:
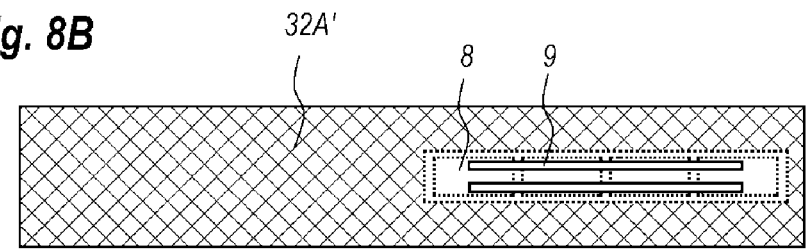
FIG. 8B shows a plan view of the semiconductor substrate after the formation of the grooves and etching a portion of the dummy layers exposed in the grooves.

Similar to the process of the third embodiment shown in FIG. 5C, the process of the present embodiment also forms two grooves 9 within which the dummy layer 32A is exposed, or piercing the dummy layer 32A, as shown in FIG. 7C. Thereafter, an etchant such as a mixture of sulfuric acid, hydrogen peroxide and water, which shows an etching rate for the dummy layer 32A enough greater than an etching rate of the substrate 1 and the supplemental layer 1a which are made of InP, may remove only the dummy layer 32A beneath the mesa 50. Other dummy layers 32A' independent of the mesa 50 are left, and the supplemental layer 1a provided between the dummy layer 32A and other dummy layers 32A' operates as a bulwark for the etchant. Referring to FIG. 8B, areas sandwiched by the dummy layer 32A' and the voids 8 correspond to the mask 31A shown in FIG. 8A and FIG. 6A. In a selective growth of a semiconductor layer, as the coverage of the mask becomes smaller, a deposition rate on a mask is reduced while a growth rate of the semiconductor layer on areas exposed from the mask, thus, the grown semiconductor layer may show a smoother surface. The patterned mask 31A of the present embodiment in the coverage thereof is reduced to less than 5% for a whole surface of the semiconductor substrate 1, where the present embodiment has the coverage of about 1%. Thus, the present embodiment may be an effective technique to provide an epitaxial substrate having a smooth surface even when the substrate partly buries a material different from the mother substrate. The mask 31 may have a width of, for instance, about 20 μm.

Fifth Embodiment

The number of corrugations 7a in the diffraction grating 7 and the length of the space region between the diffraction gratings 7 strongly influence the performance of the semiconductor optical device 100. As described, the diffraction gratings 7 of the present embodiment may be formed by the EB photolithography and an ordinary photolithograph using ultraviolet rays for forming the space regions. Such two-step exposures possibly vary the count of the corrugations 7a in the diffraction grating 7. One diffraction grating 7 generally includes 10 to 20 corrugations 7a. Accordingly, even variation of ±1 corrugation strongly affects optical characteristics of the semiconductor optical device 100. Accordingly, the present embodiment prepares various types of the sampled gratings and one of the sampled gratins may be selected during the process of forming the semiconductor optical device 100 and the waveguide layer 6 may be formed above the selected diffraction grating.

However, the process according to the present invention buries the dummy layers, 32, 32A, and 132 within the substrate 1, which means that the waveguide layer 6 is necessary to be aligned with the dummy layers, 32, 32A, and 132. The present embodiment forms the dummy layers 32B in the respective diffraction gratings 7. The selection of the diffraction gratings 7 may accompany with the selection of the dummy layers 32B.

Figure 10A:
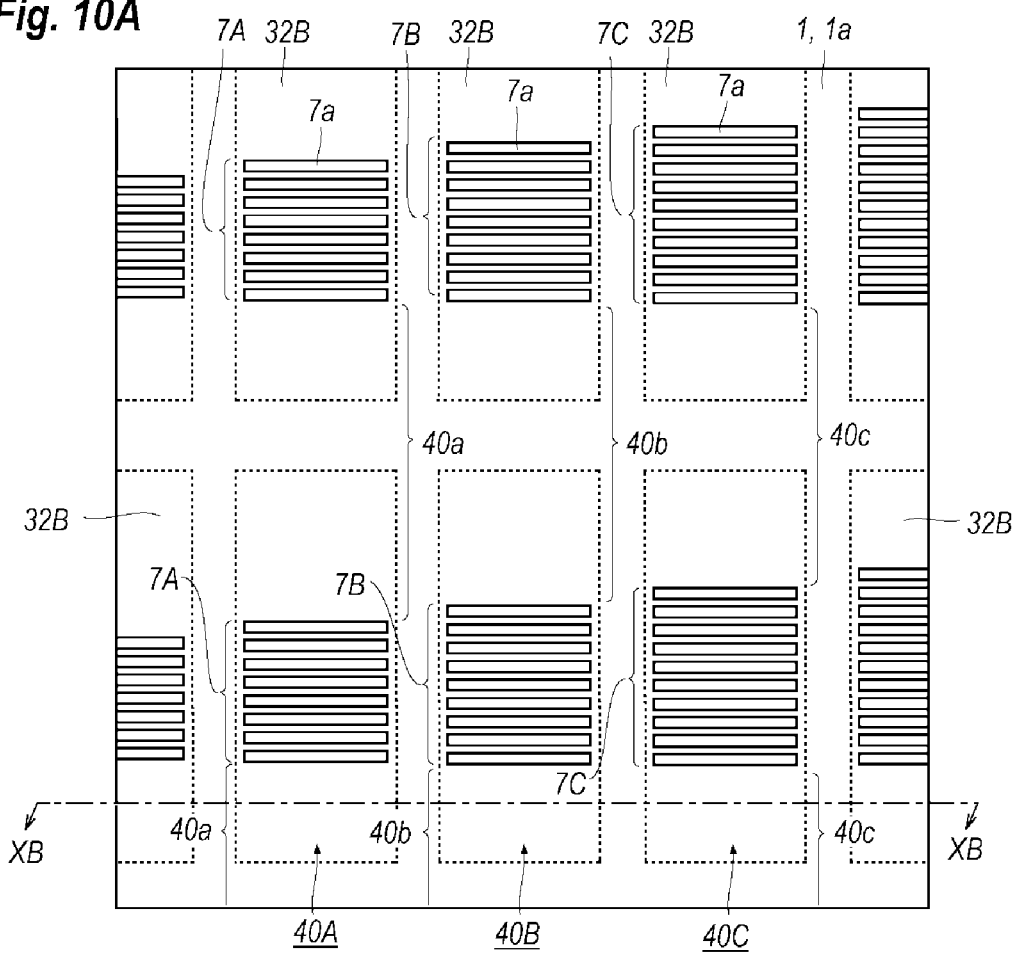
FIG. 10A is a plan view of various sampled gratings prepared on the supplemental layer according to the fifth embodiment of the present invention.
Figure 13A:
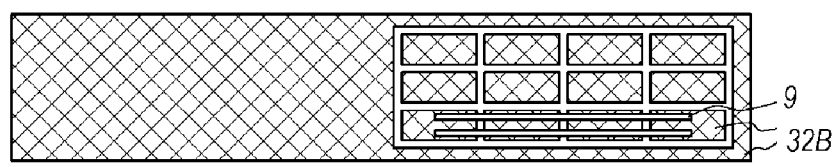
FIG. 13A is a plan view showing a step of forming the grooves.
Figure 13B:
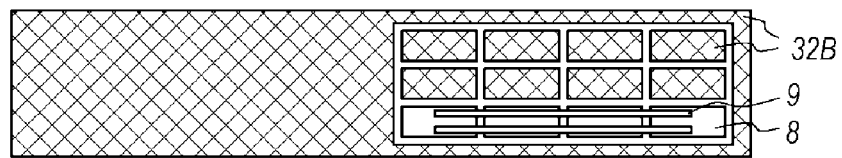
FIG. 13B is a plan view showing a step of removing a portion of the dummy layers through the grooves.

Figures from 9A to 9C, 10B, 10C and from 11A to 12B show cross sections of the semiconductor optical device at respective steps of forming the semiconductor optical device; while, FIG. 10A, FIG. 13A and FIG. 13B are plan views of the semiconductor optical device at the steps of the process of forming the semiconductor optical device.

Figure 9A:
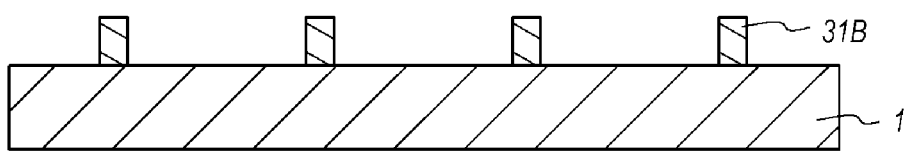
FIG. 9A to FIG. 9C show cross sections at respective steps of the process of forming the semiconductor optical device according to the fifth embodiment of the present invention.
Figure 9B:
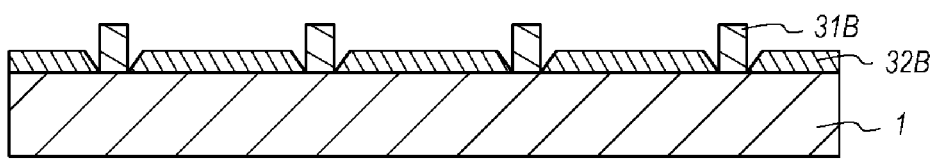

As FIG. 9A shows, the patterned mask 31B is first formed on the semiconductor substrate made of InP, where the patterned mask 31B has a width narrower than 20 μm. Then, the dummy layer 32B is selectively grown on the substrate 1 by a thickness of, for instance, 100 nm in areas exposed between the patterned mask 31B, as shown in FIG. 9B. Referring to FIG. 13A, the dummy layers 32B almost covers the whole wafer with the coverage of the patterned mask 31B of about 1% similar to the aforementioned embodiment. The dummy layers 32B are disposed in an array in the area where the diffraction gratins 7 is to be formed. The patterned mask 31B may be made of $SiO_2$ and the dummy layers 32B may be made of InGaAs same with those of the aforementioned embodiment. The process may grow the protecting layer 33 on the dummy layers 32B as shown in FIG. 4B.

Figure 9C:
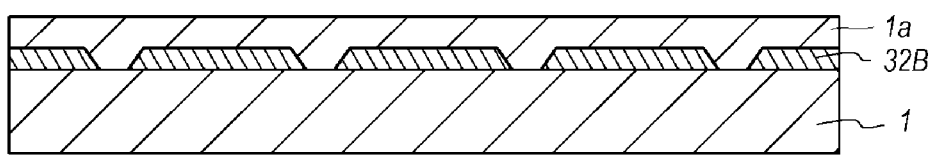

Thereafter, the supplemental layer 1a may bury the dummy layers 32B after removing the patterned mask 31B as shown in FIG. 9C. The supplemental layer 1a may show a flat and smooth top surface thereof because the coverage of the patterned mask 31B is small enough. Thus, the process of the embodiment may prepare an epitaxial substrate for the semiconductor optical device.

Figure 10B:
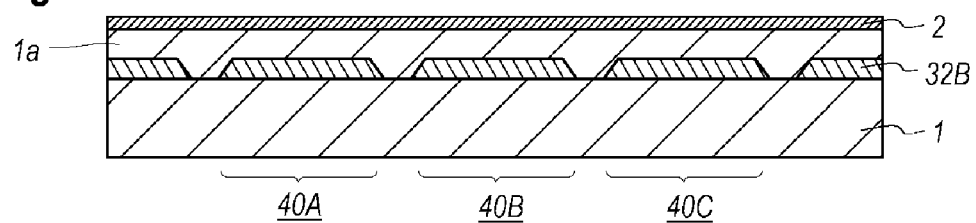
FIG. 10B and FIG. 10C show cross section at respective steps subsequent to the step shown in FIG. 9C.

Then, various types of the corrugations 7a, namely, the diffraction gratings 7, are formed on thus prepared epitaxial substrate as shown in FIG. 10A that is a plan view showing the corrugations 7a formed on the supplemental layer 1a, while, FIG. 10B shows a cross section taken along the line XB-XB indicated in FIG. 10A that shows three types of diffraction gratins, 7A to 7C, or the sampled gratings, 40A to 40C. In FIG. 10B, the lower cladding layer 2 buries the corrugations 7a.

In the present embodiment, various sampled gratings 40A to 40C, each having diffraction gratings, 7A to 7C, and spaces, 40a to 40c, are formed on the supplemental layer 1a. The first sampled diffraction grating 40A is composed of the diffraction gratings 7A and the spaces 40a arranged alternatively along the optical axis. The diffraction gratings 7A and the spaces 40a are disposed above, or overlap with the dummy layer 32B. The second and the third sampled gratings, 40B and 40C, are composed of the diffraction gratins 7B and the space 40b, and the diffraction gratings 7C and the spaces 40c, respectively. The first to third diffraction gratings, 7A to 7C, have optical lengths increasing in this order; while, the spaces, 40a to 40c, also have optical lengths decreasing in this order. The dummy layers 32B are independently provided beneath the respective sampled gratings, 40A to 40C. The sampled gratings, 40A to 40C, have the optical lengths same with each other. That is, a summed length of the first diffraction grating 7A with the first space 40a, a summed length of the second diffraction grating 7B with the second space 40b, and a summed length of the third diffraction grating 7C with the third space 40c are substantially equal to each other.

Although FIG. 10A illustrates the corrugations 7a arranged in outermost in the respective diffraction gratings, 7A to 7C, that have a full width along the optical axis; the duplicated exposure possibly causes an imperfect width in the outermost corrugations. Accordingly, the embodiment prepares various types of the diffraction gratings, 7A to 7C, each containing the corrugations 7a whose counts are different from each other. The number of the corrugations 7a and the shape thereof involved in the respective diffraction gratins, 7A to 7C, may be investigated by, for instance, the scanning electron microscope (SEM).

Figure 10C:
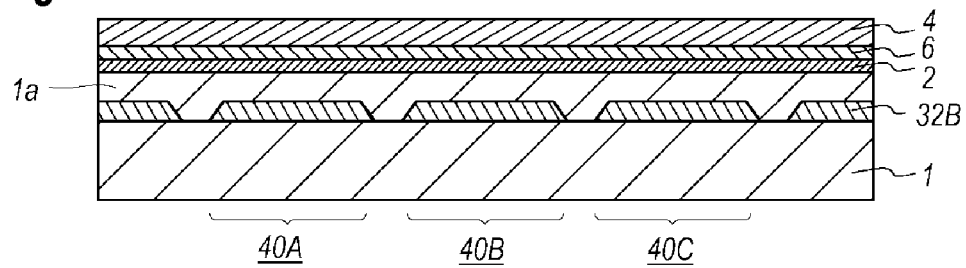

After the formation of the lower cladding layer 2, a space layer, which is not shown in the figure, and the active layer 3 or the waveguide layer 6 on the lower cladding layer 2. The active layer 3 and the waveguide layer 6 are formed complementary. That is, the process partially removes the active layer 3 after the growth it to form a hollow on the lower cladding layer 2, and selectively grows the waveguide layer 6 only in the exposed surface of the lower cladding layer 2 within the hollow. The active layer 3 and the waveguide layer 6 have respective surfaces smoothly continuing to each other. That is, the top levels of the active layer 3 and the waveguide layer 6 are substantially equal to each other. After the formation of the waveguide layer 6, the process epitaxially grows the upper cladding layer 4 and the contact layer made of InGaAs on the top surfaces of the active layer 3, as shown in FIG. 10C.

Figure 11A:
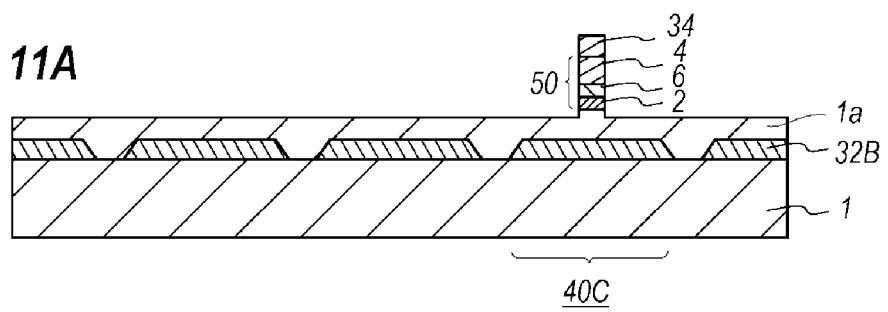
FIG. 11A to FIG. 11C show cross sections at respective steps subsequent to the step shown in FIG. 10C.

Thereafter, only one of the sampled gratings, 40A to 40C, is selected for the subsequent process based on the investigation by, for instance, the SEM. That is, assuming the sampled grating 40C is selected, the patterned mask 34 that has a striped shape is prepared only on the third sampled grating 40C. Other sampled gratings, 40A and 40B, are removed by etching the semiconductor layers, 2 to 6, concurrently with the formation of the mesa 50, as shown in FIG. 11A.

Figure 11B:
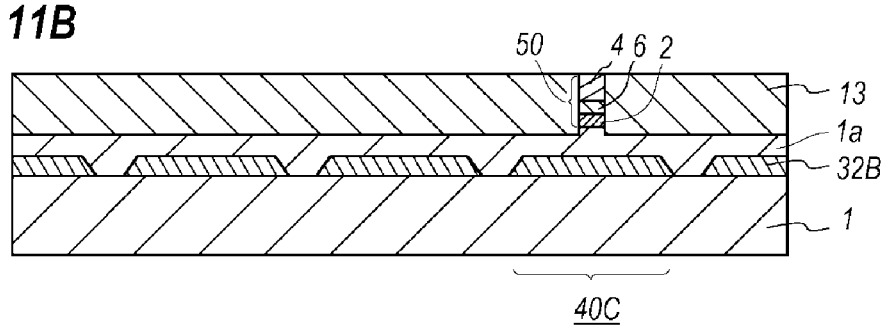
Figure 11C:
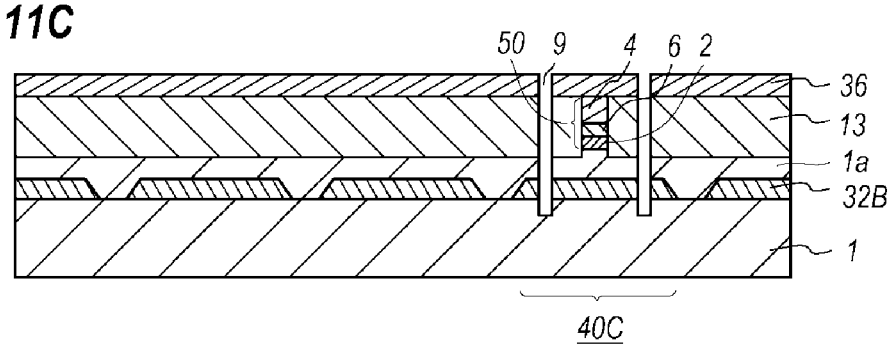
Figure 12A:
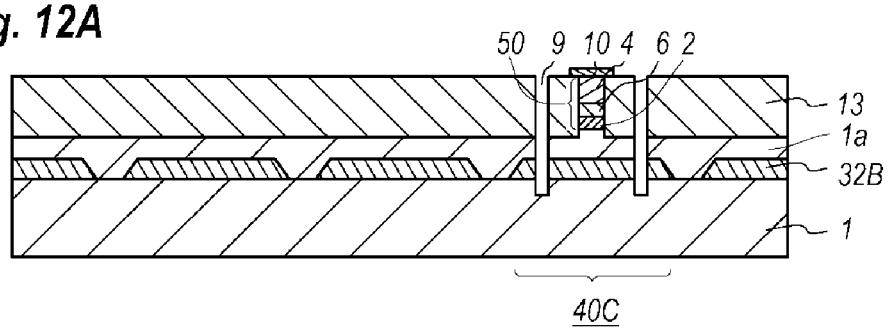
FIG. 12A and FIG. 12B show cross sections at respective steps subsequent to the step shown in FIG. 11C.
Figure 12B:
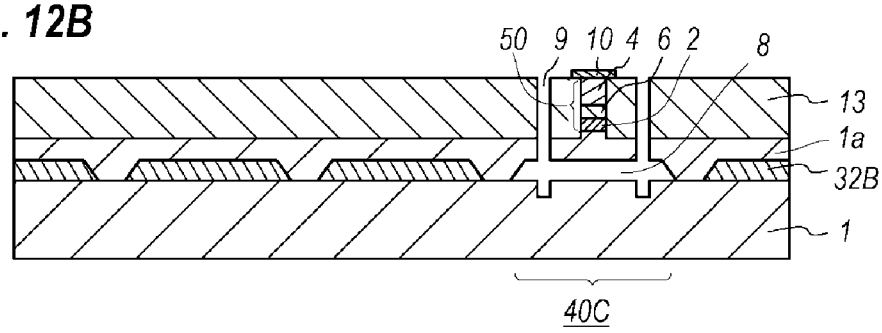

Thereafter, the process selectively grows the burying layer 13 in the respective sides of the mesa 50, as shown in FIG. 11B, and forms the grooves 9 using another patterned mask 36, where the grooves reach the dummy layer 32B beneath the mesa 50 and sandwich the mesa 50. Then, after the removal of the mask 36, the heater 10 is formed on the upper cladding layer 4 interposing with an insulating film, which is not shown in FIG. 12A. Exposing the dummy layer 32B to an etchant of a mixture of sulfuric acid, hydrogen peroxide, and water through the grooves 9; the voids 8 may be formed beneath the mesa 50, as shown in FIG. 12B. The etchant above is unable to solve the dummy layers 32B except for that exposed through the grooves 9.

The present embodiment may not only provide the epitaxial substrate with the smooth top surface of the supplemental layer 1a because the coverage by the mask 31B is relatively small enough but select one of the sampled gratings to show an adequate arrangement including the shapes and the counts of the corrugations within the diffraction grating 7. Thus, the semiconductor optical device 100 of the present invention may show excellent and designed performances.

While particular embodiment of the present invention has been described herein for purposes of illustration, many modifications and changes will become apparent to those skilled in the art. Accordingly, the appended claims are intended to encompass all such modifications and changes as fallen within the true spirit and scope of this invention.

The present application claims the benefit of priority of Japanese Patent Application No. 2017-009601, filed on Jan. 23, 2017, which is incorporated herein by reference.

What is claimed is:

1. A process of forming an epitaxial substrate that includes a void within a first semiconductor layer and a second semiconductor layer, the process comprising steps of:
   forming a patterned mask on a first semiconductor layer that is made of first semiconductor material;
   forming a dummy layer that is made of specific semiconductor material on a surface of the first semiconductor layer exposed from the patterned mask, the specific semiconductor material being different from the first semiconductor material;
   removing the patterned mask;
   burying the dummy layer by forming a second semiconductor layer on the dummy layer and the first semiconductor layer that is exposed from the dummy layer, the second semiconductor layer being made of second semiconductor material that is different from the specific semiconductor material;
   exposing a portion of the dummy layer by removing a portion of the second semiconductor layer; and
   forming the void by immersing the first semiconductor layer, the dummy layer, and the second semiconductor layer within a solution that shows an etching rate for the specific semiconductor material enough faster than an etching rate for the first semiconductor material and the second semiconductor material, the epitaxial substrate leaving the void in a region where the dummy layer had existed.

2. The process according to claim 1, further including a step of forming a waveguide structure on the second semiconductor layer so as to overlap with the void.

3. The process according to claim 1, wherein the step of forming the dummy layer further includes a step of forming a third semiconductor layer on the dummy layer, the third semiconductor layer being made of semiconductor material substantially identical with the second semiconductor material.

4. The process according to claim 1, wherein the first semiconductor material and the second semiconductor material are indium phosphide (InP), and the specific semiconductor material is one of indium gallium arsenide (InGaAs), indium gallium arsenide phosphide (InGaAsP), indium gallium aluminum arsenide (InGaAlAs), indium aluminum arsenide phosphide (InAlAsP), and indium gallium aluminum arsenide phosphide (InGaAlAsP), and wherein the solution is a mixture of sulfuric acid, hydrogen peroxide, and water.

5. A process of forming a semiconductor optical device that provides a waveguide structure and a heater provided above the waveguide structure, the heater varying a temperature of the waveguide structure, the process comprising steps of:
   forming a striped mask on a semiconductor substrate;
   selectively growing a dummy layer on the semiconductor substrate exposed from the striped mask;
   removing the striped mask;
   burying the dummy layer by growing a supplemental layer on the dummy layer and the semiconductor substrate exposed from the dummy layer;
   forming the waveguide structure on the supplemental layer so as to overlap with a void;
   forming a groove in the supplemental layer, the groove reaching the dummy layer; and
   immersing the semiconductor substrate within an etchant so as to form a void in a region the dummy layer exists, the etchant showing an etching rate for the dummy layer enough faster than an etching rate for the supplemental layer and the semiconductor substrate.

6. The process according to claim 5, wherein the step of selectively growing the dummy layer includes a step of growing a protecting layer on the dummy layer, the protecting layer being made of semiconductor material same with a semiconductor material of the supplemental layer.

7. The process according to claim 5, wherein the step of forming the waveguide structure includes steps of:
   sequentially growing a lower cladding layer, a waveguide layer, and an upper cladding layer on the supplemental layer;
   forming a mesa including the lower cladding layer, the waveguide layer, and the upper cladding layer by etching a portion of the upper cladding layer, a portion of the waveguide layer, and a portion of the lower cladding layer, the mesa overlapping with the void;
   burying the mesa by forming a burying layer in respective sides of the mesa on the supplemental layer,
   wherein the step of forming the groove includes a step of sequentially etching the burying layer and the supplemental layer, the groove being apart from the mesa.

8. The process according to claim 7,
wherein the step of growing the lower cladding layer includes steps of:
- forming diffraction gratings on the supplemental layer, the diffraction gratings each including corrugations and being arranged periodically with interposing spaces therebetween, the spaces including no corrugations, and
- burying the corrugations by the lower cladding layer, wherein the corrugations are made of semiconductor material having refractive index different from refractive index of a semiconductor material constituting the lower cladding layer.

9. The process according to claim 8,
wherein the step of forming the diffraction gratings includes a step of forming a plurality of sampled gratings each including the diffraction gratings having a pitch common to the sampled gratings but including corrugations with a count different from each other in the sampled gratings, and wherein the step of forming the mesa includes steps of:
selecting one of the sampled gratings; and
removing other of the sampled gratings concurrently with the etching of the portion of the upper cladding layer, the portion of the waveguide layer, and the portion of the lower cladding layer.

10. The process according to claim 5,
wherein the semiconductor substrate and the supplemental layer are made of indium phosphide (InP), and the dummy layer is made of one of indium gallium arsenide (InGaAs), indium gallium arsenide phosphide (InGaAsP), indium gallium aluminum arsenide (InGaAlAs), indium aluminum arsenide phosphide (InAlAsP), and indium gallium aluminum arsenide phosphide (InGaAlAsP), and wherein the etchant is a mixture of sulfuric acid, hydrogen peroxide, and water.

\* \* \* \* \*